United States Patent
Ni et al.

(10) Patent No.: US 8,480,913 B2
(45) Date of Patent: Jul. 9, 2013

(54) PLASMA PROCESSING METHOD AND APPARATUS WITH CONTROL OF PLASMA EXCITATION POWER

(75) Inventors: Tuqiang Ni, Pleasanton, CA (US); Weinan Jiang, San Jose, CA (US); Frank Y. Lin, Fremont, CA (US); Chung-Ho Huang, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/172,917

(22) Filed: Jun. 30, 2011

(65) Prior Publication Data
US 2011/0253673 A1    Oct. 20, 2011

Related U.S. Application Data

(63) Continuation of application No. 09/821,753, filed on Mar. 30, 2001, now abandoned.

(51) Int. Cl.
*C23F 1/00* (2006.01)
*C23F 1/08* (2006.01)

(52) U.S. Cl.
USPC .................................. 216/67; 156/345.28

(58) Field of Classification Search
None
See application file for complete search history.

(56) References Cited

U.S. PATENT DOCUMENTS

| | | |
|---|---|---|
| 5,346,584 A | 9/1994 | Nasr et al. |
| 5,361,174 A | 11/1994 | Seki et al. |
| 5,422,289 A | 6/1995 | Pierce |
| 5,716,534 A | 2/1998 | Tsuchiya et al. |
| 5,807,789 A | 9/1998 | Chen et al. |
| 5,824,602 A | 10/1998 | Molvik et al. |
| 5,843,226 A | 12/1998 | Zhao et al. |
| 6,051,503 A | 4/2000 | Bhardwaj et al. |
| 6,599,842 B2 | 7/2003 | Chao et al. |
| 2002/0106845 A1 | 8/2002 | Chao et al. |

FOREIGN PATENT DOCUMENTS

| | | |
|---|---|---|
| JP | 2001-085395 | 3/2001 |
| WO | 00/58992 | 10/2000 |

*Primary Examiner* — Allan Olsen
(74) *Attorney, Agent, or Firm* — Klintworth & Rozenblat IP LLC (57) ABSTRACT

The amount of RF power supplied to a plasma in a vacuum plasma processing chamber is gradually changed on a pre-programmed basis in response to signals stored in a computer memory. The computer memory stores signals so that other processing chamber parameters (pressure, gas species and gas flow rates) remain constant while the gradual change occurs. The stored signals enable rounded corners, instead of sharp edges, to be etched, e.g., at an intersection of a trench wall and base.

50 Claims, 3 Drawing Sheets

PLASMA PROCESSING METHOD AND APPARATUS WITH CONTROL OF PLASMA EXCITATION POWER

RELATED APPLICATION

The present application is a continuation of U.S. patent application Ser. No. 09/821,753, filed Mar. 30, 2001 now abandoned, the disclosure of which is hereby incorporated by reference herein in its entirety.

FIELD OF INVENTION

The present invention relates generally to vacuum plasma processors for processing workpieces on a workpiece holder and more particularly to a method of and apparatus for gradually changing, on a preprogrammed basis, power an AC plasma excitation source supplies to plasma in a vacuum processor chamber.

BACKGROUND ART

Vacuum processors for processing a workpiece (i.e., etching materials from or depositing materials onto the workpiece) typically include first and second ports respectively connected to a vacuum pump and one or more gas sources. The gas is excited to a plasma in the chamber by an electric source including a reactance responsive to a first AC source, typically an RF or microwave source. A first matching network is usually connected between the first AC source and the reactance for exciting the plasma. If the source is an RF source, the reactance is either a coil for supplying magnetic and electric fields to the chamber interior via a dielectric window or a parallel plate capacitive arrangement for supplying an electric field to the chamber interior.

The workpiece, which is typically a semiconductor wafer or a dielectric sheet or a metal plate, is clamped in piece on a workpiece holder, i.e., chuck, that frequently includes an electrode covered by a dielectric. DC voltage is typically applied to the electrode to provide an electrostatic clamping force to hold the workpiece in situ on the holder. The workpiece is usually cooled by applying a coolant agent, such as helium, to a recess in the chuck and by applying a liquid to conduits in the chuck. To accelerate ions in the plasma to the workpiece, a second AC source is connected to the electrode by way of a matching network. Each matching network includes a pair of variable reactances having values that are varied by motors, typically step motors.

Sensors for electric parameters associated with the plasma, as coupled to the excitation reactance and as coupled to the chuck electrode, derive signals which assist in controlling the values of the variable reactances. Pressure and flow rate transducers respectively in the chamber and in a line supplying gas to the second port derive signals which assist in controlling the vacuum pressure in the chamber and the flow rate of gas flowing into the chamber through the second port.

A controller, including a microprocessor and a memory system including a hard drive, random access memory (RAM) and a read only memory (ROM), responds to the signals derived by the transducers and signals from an operator input console to produce signals for controlling the variable reactances, output power of the two AC sources, the vacuum pressure in the chamber and the flow rate of gases supplied to the chamber through the second port. The memory system stores several recipes, each in the form of signals representing various parameters controlling the deposition and etching of the workpieces for differing situations.

The parameters of each recipe are, inter alia, gas species to be supplied to the chamber, flow rates of the species, vacuum pressure in the chamber and output powers of the two AC sources. Each recipe can include other parameters, such as time for carrying out each recipe step. The controller responds to the parameters of the recipe to control valves for the flow of the gases into the chamber, the chamber pressure, as well as the output power of the first and second AC sources. During processing, the controller controls the reactances of the first and second matching networks so that there is an efficient transfer of power between the first and second AC sources and the loads they drive so the impedances seen looking into the output terminals of the first and second sources are substantially equal to the impedances the first and second sources respectively see by looking from their output terminals into cables connected to the first and second matching networks.

Typically, a recipe change has been marked by step, i.e. sudden, changes in at least one of (1) gas flow rate, (2) chamber pressure, (3) power supplied to a plasma excitation coil, (4) the gas species flowing into the chamber, and (5) power supplied to (a) an electrode, such as bottom electrode on which the workpiece is mounted or a top electrode for exciting a gas to a plasma, or (b) RF plasma excitation coil. These step changes result in sharp demarcations between layers etched from the workpiece or deposited on the workpiece. For example, the step changes during etching of a trench in a workpiece, e.g., a silicon substrate, result in sharp corners between a wall and base of the trench. Such step changes also frequently result in sharp corners at a boundary between a trench wall and a layer at the top of the trench. Such sharp corners can make it difficult to fill the trench during subsequent operations and have other known disadvantages, such as causing stress related defects and/or electrical leakage.

One method of addressing the problem which has resulted in somewhat smooth transitions when certain recipe changes are made involves adding dilutants, such as argon or helium, or passivation gases, such as oxygen, on a transient basis, to gases flowing into the processing chamber during a process recipe step occurs. However, there are disadvantages in transiently adding dilutant and/or passivation gases to the processing chamber. Because of the relatively large volume of a typical plasma processing chamber, a significant amount of time, up to ten seconds, is required to purge "old" gas from a line coupling gas from a gas source into the chamber. As a result, there are substantial increases in workpiece processing time, to reduce chamber efficiency and decrease workpiece throughput. In addition, changing the gas species on a transient basis results in a change in plasma impedance. The change in plasma impedance adversely affects the ability of the matching network between the electric source and the coil and/or electrode to provide an efficient transfer of power between the source or sources and the driven loads. In addition, the time for the new gas, i.e., the dilutant or passivation gas, to flow into the chamber is likely to vary as a function of gas line length between the chamber and the gas source. As a result, precise control of the processing step is difficult to achieve and/or recipe processing steps must be customized for the different gas line lengths between the different gas sources and the chamber.

Chen at al, U.S. Pat. No. 5,807,789 discloses a method of operating a plasma processor to form in a semiconductor workpiece a shallow trench with a tapered profile and round corners. Such a shallow trench is formed during successive recipe steps. During a first step the plasma power and chamber pressure are respectively relatively high and low. During the next steps, the plasma power and chamber pressure are respectively decreased and increased. The process continues in this way for at least one additional step.

In a particular etching embodiment Chen et al discloses, the plural gas species applied to the chamber remain the same and at constant flow rates while power supplied to the plasma is reduced in three steps, each of which occurs simultaneously with an increase in chamber pressure. During a first step, which lasts for eight seconds, the power supplied to a plasma excitation reactance and chamber pressure are respectively 800 watts and 50 millitorr. At the beginning of a second eight second step, the supplied power is reduced suddenly from 800 watts to 750 watts while chamber pressure is increased suddenly to 80 millitorr. At the beginning of a third 46 second step, supplied power is suddenly reduced further to 650 watts while chamber pressure is suddenly increased to 100 millitorr.

The aforementioned process suffers from similar problems to the previously mentioned problems associated with adding dilutants because of the substantial time required to change pressure in the relatively large volume vacuum chamber. In addition, the sudden power changes frequently do not enable the corners to be rounded to the desired extent.

It is, accordingly, an object of the invention to provide a new and improved method of and apparatus for operating a vacuum plasma processing chamber.

An additional object of the invention is to provide a new and improved method of and apparatus for operating a vacuum plasma processing chamber in such a manner that sharp corners on processed workpieces are avoided.

Another object of the invention is to provide a new and improved method of and apparatus for controlling a vacuum plasma processor such that changes in a processing recipe are performed in a manner which avoids sharp corners on a processed workpiece.

Still another object of the invention is to provide a new and improved method of and apparatus for processing a workpiece in a vacuum plasma workpiece processor so that changes during a recipe are performed in such a way as to avoid sharp corners in a processed workpiece and wherein processor throughput is relatively high.

Still another object of the invention is to provide a new and improved method of and apparatus for controlling processing of workpieces in a vacuum plasma processor, wherein changes in steps of a recipe are performed in such a way that sharp corners of the workpiece are avoided, without substantial impedance mismatches occurring between one or more sources driving reactive components which supply power to processing gas in the chamber.

SUMMARY OF THE INVENTION

In accordance with the present invention, AC power supplied to a plasma in a vacuum plasma workpiece processing chamber is controlled or a preprogrammed basis so there are gradual changes in the amount of AC power supplied to the plasma during processing of one workpiece. Preferably, the gradual power change occurs while no change is made in (a) the gas species flowing into the chamber, (b) the chamber pressure or (c) the gas species flow rates. The AC power can be supplied to the chamber by an upper or lower chamber electrode coupling an AC electric field to gas in the chamber or a coil coupling an AC electromagnetic field to the chamber gas. The gradual power change is typically such that it causes a gradual transition in the shape of material in the processed workpiece.

In one preferred embodiment, a gas species is ionized into a plasma that etches the material and the preprogrammed gradual power change and the species are such that the material is shaped so a rounded corner is formed in the material as a result of the etching. In one specific application, the etching forms a trench wall including the rounded corner, which in one embodiment is at an intersection of a wall and a base of a trench.

The gradual change is typically performed in response to a computer program storing steps having (1) power changes in the range of a few milliwatts to less than 5% of the maximum output power of a source (e.g., if a source has a maximum output power of 3 kW, the maximum power change is 150 watts), and (2) durations in the range of about 1 millisecond to about 1 second. Steps having power changes greater than about 5% of maximum output power are too steep to provide the desired control over the plasma to achieve the desired workpiece shapes and steps lasting longer than about 1 second do not have adequate temporal resolution to achieve the desired workpiece shapes.

The above and still further objects, features and advantages of the present invention will become apparent upon consideration of the following detailed description of several specific embodiments thereof, especially when taken in conjunction with the accompanying drawings.

DETAILED DESCRIPTION OF THE DRAWING

Figure 1:
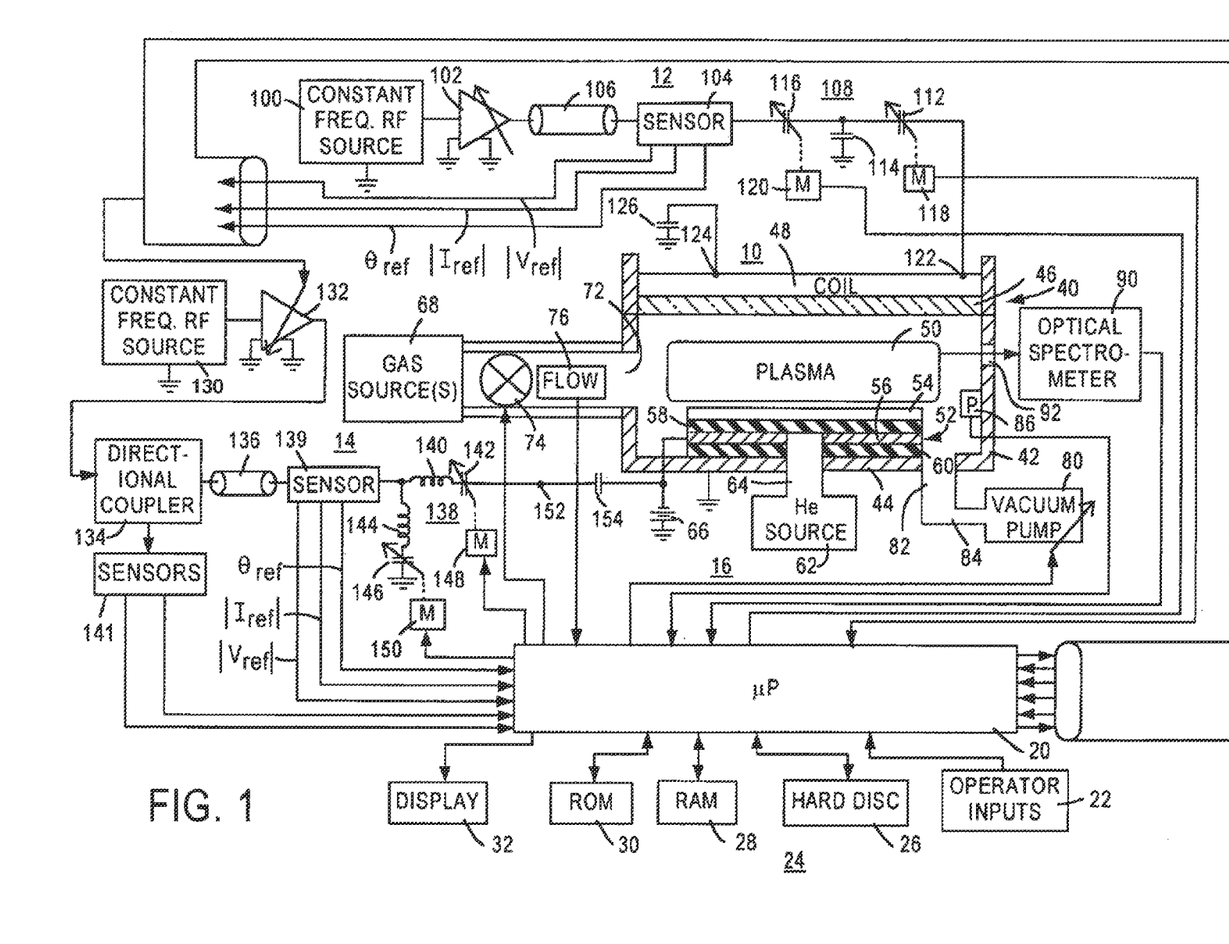
FIG. 1 is a block diagram of a typical vacuum plasma processor and controller capable of performing the present invention.

The workpiece processor illustrated in FIG. 1 includes vacuum plasma processing chamber assembly 10, a first circuit 12 for driving a reactance for exciting ionizable gas in chamber assembly 10 to a plasma state, a second circuit 14 for applying RF bias to a workpiece holder in chamber assembly 10, and a controller arrangement 16 responsive to sensors for various parameters associated with chamber assembly 10 for deriving control signals for devices affecting the plasma in chamber assembly 10. Controller 16 includes microprocessor 20 which responds to various sensors associated with chamber assembly 10, as well as circuits 12 and 14, and signals from operator input 22, which can be in the form, for example, of a keyboard. Microprocessor 20 is coupled with memory system 24 including hard disk 26, random access memory (RAM) 28 and read only memory (ROM) 30. Microprocessor 20 responds to the various signals supplied to it to drive display 32, which can be a typical computer monitor.

Hard disk 26 and ROM 30 store programs for controlling the operation of microprocessor 20 and preset data associated with different recipes for the processes performed in chamber assembly 10. The different recipes concern gas species and flow rates applied to chamber assembly 10 during different processes, the output power of AC sources included in circuits 12 and 14, the vacuum applied to the interior of chamber assembly 10, and initial values of variable reactances included in matching networks of circuits 12 and 14.

Plasma chamber assembly 10 includes chamber 40 having metal, non-magnetic cylindrical side wall 42 and metal, non-magnetic base 44, both of which are electrically grounded. Dielectric, typically quartz, window 46 is fixedly positioned on the top edge of wall 42. Wall 42, base 44 and window 46 are rigidly connected to each other by suitable gaskets to enable a vacuum to be established within the interior of chamber 40. Planar plasma excitation coil 48, for example, as configured in Ogle, U.S. Pat. No. 4,948,458 or Holland et al., U.S. Pat. No. 5,759,280, sits on or in very close proximity to the upper face of window 46. Coil 48, an electric reactance, reactively supplies magnetic and electric AC fields usually at an RF frequency such as 13.56 MHz, to the interior of chamber 40, to excite ionizable gas in the chamber to plasma, schematically illustrated in FIG. 1 by reference numeral 50. It is to be understood that for the purposes of the present invention, coil 48 can be replaced with a powered or grounded electrode that extends parallel to electrode 56 and can be located in chamber 40.

The upper face of base 44 carries holder, i.e. chuck, 52 for workpiece 54, which is typically a circular semiconductor wafer, a rectangular dielectric plate such as used in flat panel displays or a metal plate. Chuck holder 52 typically includes metal plate 56 that forms an electrode (a reactive element). Electrode 56 carries dielectric layer 58 and sits on dielectric layer 60, which is carried by the upper face of base 44. A workpiece handling mechanism (not shown) places workpiece 54 on the upper face of dielectric layer 58. Workpiece 54 is cooled by supplying helium from a suitable source 62 to the underside of dielectric layer 58 via conduit 64 and grooves (not shown) in electrode 56 and by supplying a liquid from a suitable source (not shown) to conduits (not shown) in chuck 52. With workpiece 54 in place on dielectric layer 58, DC source 66 supplies a suitable voltage through a switch (not shown) to electrode 56 to clamp, i.e., chuck, workpiece 54 to chuck 52.

With workpiece 54 secured in place on chuck 52, one or more ionizable gases from one or more sources 68 flow into the interior of chamber 40 through conduit 70 and port 72 in sidewall 42. For convenience, only one gas source 68 is shown in FIG. 1, but it is to be understood that usually there are several gas sources of different species, e.g. etchants, such as $SF_6$, $CH_4$, $C_{12}$ and HBr, dilutants such as Ar or He, and $O_2$ as a passivation gas. The interior of conduit 70 includes valve 74 and flow rate gauge 76 for respectively controlling the flow rate of gas flowing through port 72 into chamber 40 and measuring the gas flow rate through port 72. Valve 74 responds to a signal microprocessor 20 derives, while gauge 76 supplies the microprocessor with an electric signal indicative of the gas flow rate in conduit 70. Memory system 24 stores for each recipe step of each workpiece 54 processed in chamber 40 a signal indicative of desired gas flow rate in conduit 70. Microprocessor 20 responds to the signal memory system 24 stores for desired flow rate and the monitored flow rate signal gauge 76 derives to control valve 74 accordingly.

Vacuum pump 80, connected to port 82 in base 44 of chamber 40 by conduit 84, evacuates the interior of the chamber to a suitable pressure, typically in the range of one to one hundred millitorr. Pressure gauge 86, in the interior of chamber 40, supplies microprocessor 20 with a signal indicative of the vacuum pressure in chamber 40. Memory system 24 stores for each recipe step a signal indicative of desired vacuum pressure for the interior of chamber 40. Microprocessor 20 responds to the stored desired pressure signal memory system 24 derives for each recipe step and an electric signal from pressure gauge 86 to supply an electric signal to vacuum pump 80 to maintain the pressure in chamber 40 at the set point or predetermined value for each recipe step.

Optical spectrometer 90 monitors the optical emission of plasma 50 by responding to optical energy emitted by the plasma and coupled to the spectrometer via window 92 in side wall 42. Spectrometer 90 responds to the optical energy emitted by plasma 50 to supply an electric signal to microprocessor 20. Microprocessor 20 responds to the signal that spectrometer 90 derives to detect an end point of the process (either etching or deposition) that plasma 50 is performing on workpiece 54. Microprocessor 20 responds to the signal spectrometer 90 derives and a signal memory system 24 stores indicative of a characteristic of the output of the spectrometer associated with an end point to supply the memory with an appropriate signal to indicate that the recipe step has been completed. Microprocessor 20 then responds to signals from memory system 24 to stop certain activities associated with the completed recipe step and initiate a new recipe step on the workpiece being processed in chamber 40 or commands release of workpiece 54 from chuck 52 and transfer of a new workpiece to the chuck, followed by instigation of another series of recipe processing steps.

Excitation circuit 12 for driving coil 48 includes constant frequency RF source 100, having a constant output power and typically having a frequency of 13.56 MHz. Source 100 drives power amplifier 102, having an electronically controlled power gain, so that the amplifier response time is on the order of a few microseconds or less, i.e., the output power of amplifier 102 changes from a first value to a second value in a few microseconds or less. The output power of amplifier 102 is in the range between 100 and 3000 watts. Amplifier 102 typically has a 50 ohm output impedance all of which is resistive and none of which is reactive. Hence, the impedance seen looking back into the output terminals of amplifier 102 is typically represented by (50+j0) ohms, and cable 106 is chosen to have a characteristic impedance of 50 ohms.

For any particular recipe, memory system 24 stores a signal for desired output powers of amplifier 102. Memory system 24 supplies the desired output power of amplifier 102 to the amplifier by way of microprocessor 20. The output power of amplifier 102 can be controlled in an open loop manner in response to the signals stored in memory system 24 or control of the output power of amplifier 102 can be on a closed loop feedback basis, as known in the art. The output power of amplifier 102 is also gradually dynamically changed as a function of time as preprogrammed changes in a recipe step are ordered by memory system 24. The preprogrammed dynamic changes in the output power are stored in memory system 24 and control the power gain of amplifier 102.

The output power of amplifier 102 drives coil 48 via cable 106 and matching network 108. Matching network 108, typically configured as a "T," includes two series legs including variable capacitors 112 and 116, as well as a shunt leg including fixed capacitor 114. Coil 48 includes input and output terminals 122 and 124, respectively connected to one electrode of capacitor 112 and to a first electrode of series capacitor 126, having a grounded second electrode. The value of capacitor 126 is preferably selected as described in the commonly assigned, previously mentioned, Holland et al. patent.

Electric motors 118 and 120, preferably of the step type, respond to signals from microprocessor 20 to control the values of capacitors 112 and 116 in relatively small increments to maintain an impedance match between the impedance seen by looking from the output terminals of amplifier 102 into cable 106 and by looking from cable 106 into the output terminals of amplifier 102. Hence, for the previously described (50+j0) ohm output impedance of amplifier 102 and 50 ohm characteristic impedance of cable 106, microprocessor 20 controls motors 118 and 120 so the impedance seen looking from cable 106 into matching network 108 is as close as possible to (50+j0) ohms.

To control motors 118 and 120 to maintain a matched condition for the impedance seen looking into the output terminals of amplifier 132 and the impedance amplifier 132 drives, microprocessor 20 responds to signals from conventional sensor arrangement 104 indicative of the impedance seen looking from cable 106 into matching network 108. Alternatively, sensors can be provided for deriving signals indicative of the power amplifier 102 supplies to its output terminals and the power reflected by matching network 108 back to cable 106. Microprocessor 20 responds, in one of several known manners, to the sensed signals that sensor arrangement 104 derives to control motors 118 and 120 to attain the matched condition.

Circuit 14 for supplying RF bias to workpiece 54 via electrode 56 has a construction somewhat similar to circuit 12. Circuit 14 includes constant frequency RF source 130, having a constant output power and typically having a frequency such as 400 KHz, 2.0 MHz or 13.56 MHz. The output of source 130 drives electronically controlled variable gain power amplifier 132, having the same characteristics as amplifier 102. Amplifier 132 in turn drives a cascaded arrangement including directional coupler 134, cable 136 and matching network 138. Matching network 138 includes a series leg comprising the series combination of fixed inductor 140 and variable capacitor 142, as well as a shunt leg including fixed inductor 144 and variable capacitor 146. Motors 148 and 150, which are preferably step motors, vary the values of capacitors 142 and 146, respectively, in response to signals from microprocessor 20.

Output terminal 152 of matching network 138 supplies on RF bias voltage to electrode 56 by way of series coupling capacitor 154 which isolates matching network 138 from the chucking voltage of DC source 66. The RF energy circuit 14 applies to electrode 56 is capacitively coupled via dielectric layer 58, workpiece 54 and a plasma sheath between the workpiece and plasma to a portion of plasma 50 in close proximity with chuck 52. The RF energy that chuck 52 couples to plasma 50 establishes a DC, bias in the plasma; the DC bias typically has values between 50 and 1000 volts. The DC bias resulting from the RF energy circuit 14 applies to electrode 52 accelerates ions in plasma 50 to workpiece 54.

Microprocessor 20 responds to signals indicative of the impedance seen looking from cable 136 into matching network 138, as derived by a known sensor arrangement 139, to control motors 148 and 150 and the values of capacitors 142 and 146 in a manner similar to that described supra with regard to control of capacitors 112 and 116 of matching network 108.

For each process recipe step, memory system 24 stores set point signals for the net power coupled by directional coupler 134 to cable 136. The net power coupled by directional coupler 134 to cable 136 equals the output power of amplifier 132 minus the power reflected from the load and matching network 138 back through cable 136 to the terminals of directional coupler 134 connected to cable 136. Memory system 24 supplies the net power set point signal associated with circuit 14 to microprocessor 20. Microprocessor 20 also responds to output signals directional coupler 134 supplies to power sensor arrangement 141. Power sensor arrangement 141 derives signals indicative of output power of amplifier 132 and power reflected by cable 136 back toward the output terminals of amplifier 132.

Microprocessor 20 responds to the set points and measured signals sensor arrangement 141 derives, which measured signals are indicative of the output power of amplifier 132 and the power reflected hack to amplifier, to control the power gain of amplifier 132. The output power of amplifier 132 is also gradually dynamically changed as a function of time as changes in a recipe are ordered by memory systems 24. The dynamic changes in the output power are stored in memory system 24 and control the power gain of amplifier 132.

One of the elements of memory system 24, typically read-only memory 30, stores preprogrammed values for controlling the output power of amplifier 102 and/or 132 during a step of the recipe of plasma 50 processing workpiece 54. The preprogrammed values thereby control the amount of power coil 48 and/or electrode 56 supply to the plasma 50 in chamber 40 to enable the power that coil 48 and/or electrode 56 supplies to the plasma to change gradually as a function of time in accordance with a preprogrammed predetermined function, such as the mathematical functions 170 and 172 illustrated in FIGS. 2 and 3 or the empirical function 174 illustrated in FIG. 4. Functions 170 and 172 of FIGS. 2 and 3 are respectively upwardly and downwardly directed substantially continuous, gradual linear ramping functions.

The preprogrammed values for controlling the output power of amplifier 102 and/or 132 that read-only memory 30 stores are, in actuality, a series of relatively small incremental steps, each of which usually has the same value. The incremental steps are such that the output power of amplifier 102 and/or 132 changes suddenly at the beginning of each step, by a small value, in the range of about 1 milliwatt to less than 5% of the maximum output power of amplifier 102 and/or 132 (e.g., if the maximum output power of amplifier 102 is 3000 watts, the maximum change in a step of the output power of amplifier is 150 watts). Each step usually has the same relatively short duration, typically between one millisecond and one second during which the output power of amplifier 102 and/or 132 remains constant. Steps longer than one second will not usually provide the desired rounding effect previously discussed in this document. A series of steps in the foregoing ranges provides substantially continuous and gradual variations in power supplied to coil 48 and electrode 56 and therefore the power supplied to plasma 50.

Figure 2:
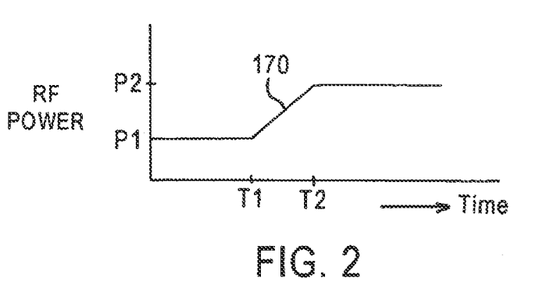
FIG. 2 is a waveform of power versus time that can be applied to the coil or electrode of the apparatus illustrated in FIG. 1, wherein power increases gradually in an upwardly ramping manner.
Figure 3:
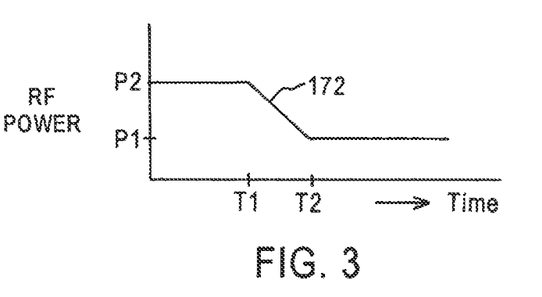
FIG. 3 is a waveform similar to the waveform of FIG. 2, wherein the power ramps downwardly.
Figure 4:
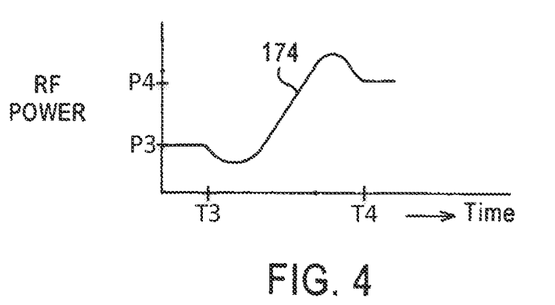
FIG. 4 is a waveform of power versus time that can be applied to the coil and/or electrode of FIG. 1, wherein the waveform is derived from experimental data.

When it is desired to change the output power of amplifier 102 and/or 132 in accordance with a preprogrammed function, such as those illustrated in any of FIGS. 2-4, the stored program in hard disk 26 periodically reads stored numeric values in read-only memory 30 indicative of the gain amplifier settings which provide the desired output power of the amplifier. Microprocessor 20 responds to the values read from read-only memory 30 to control the gain of at least one of amplifiers 102 and 132 and thereby vary the power at least one of coil 48 and electrode 56 supplies to plasma 50.

For purposes of explanation, assume that the functions of FIGS. 2, 3 and 4 represent the power RF source 130 and variable gain amplifier 132 supply to electrode 56. Prior to the beginning of ramping function 170, at time T1, memory system 24 and microprocessor 20 set the gain of amplifier 132 so that electrode 56 supplies constant power P1 to plasma 50. During a recipe step of interest, memory system 24 and microprocessor 20 control the gain of amplifier 132 to increase the power supplied to electrode 56 as indicated by linear, upwardly directed, gradually increasing and substantially continuous ramping function 170. Ramping function 170 continues until the recipe step has been completed at time T2. Thereafter, memory system 24 and microprocessor 20 maintain the gain of amplifier 132 constant so that electrode 56 supplies constant power P2 to plasma 50. Memory system 24 and microprocessor 20 control the gain of amplifier 132 and the power electrode 56 supplies to plasma 50 to gradually and substantially continuously decrease the plasma power along ramping function 172. Ramping function 172 extends from a constant value P2, at time T1, to a constant value P1, at time T2. The power decrease from P2 to P1 is performed in the same manner described for upwardly directed ramping function 170.

The slopes of ramping functions 170 and 172 are determined by the magnitude and duration of each step change in the gain of amplifier 132. Typically, the magnitude and duration of each step change in the gain of amplifier 132 for a particular recipe change are the same; it is to be understood, however, that different step changes in the gain of amplifier 132 for a particular recipe change can have different magnitude and duration values.

Function 174 of FIG. 4 is empirically derived and results from a series of experiments performed on test workpieces 54 under various RF power settings and from measurements of profile angles under these various power settings. It is to be understood that function 174 of FIG. 4 is merely for illustrative purposes and that many different empirically derived functions can be employed, as necessary. The particular function 174 varies between a constant power level P3 to a higher constant power level P4, which respectively subsist prior to time T3 and subsequent to time T4, the temporal boundaries of function 174. Function 174 decreases slowly from power level P3, then increases at a faster rate to a value above power level P4 and then returns to power level P4 at time T4.

Figure 5:
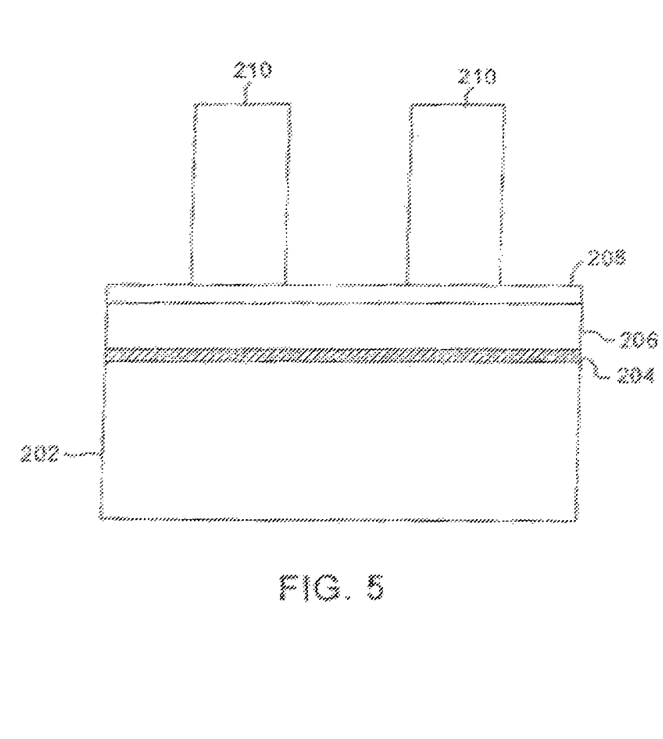
FIG. 5 is a schematic diagram of a cross section of an illustrative semiconductor wafer prior to etching.
Figure 6:
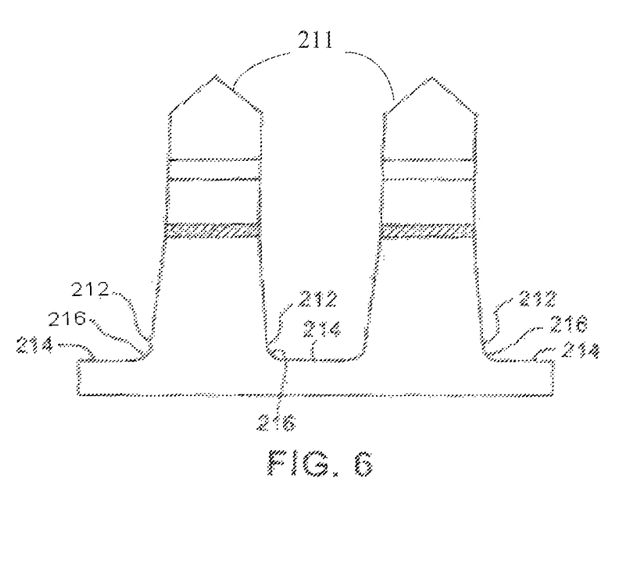
FIG. 6 is an schematic diagram of the wafer illustrated in FIG. 5 after it has been etched in accordance with a specific embodiment of the present invention.

Reference is now made to FIGS. 5 and 6 of the drawing, respectively schematic drawings of an illustrative semiconductor structure prior and subsequent to etching operations in accordance with one embodiment of the present invention. The pre-etch structure of FIG. 5 includes silicon substrate 202 having a top face coated by thin film silicon oxide layer 204, typically having a thickness of 150 angstroms, which in turn is covered by a thin film silicon nitride layer 206, typically having a thickness of 1600 angstroms. Layer 206 is coated with an epitaxial bottom anti-reflective coating 208, typically having a thickness of 570 angstroms, in turn covered by two spaced photoresist strips 210.

The structure of FIG. 5 is initially processed by reducing the height of photoresist strips 210 to form truncated photoresist strips (for example, see FIG. 6). Photoresist strips 210 are reduced in height by supplying a typical photoresist etchant from gas sources 68 to the interior of chamber 40 under the control of a program hard disk 26 stores and which is read to microprocessor 20. Simultaneously, the program that hard disk 26 stores and microprocessor 20 cause the power supplied to coil 48 and electrode 56 and the vacuum in chamber 40 to remain constant. Next, the program that hard disk 26 stores causes bottom anti-reflective coating 208 to be etched by opening valves 74 connected to hydrogen bromide (HBr) and oxygen ($O_2$) sources 68 so that the flow ratio of these gases is 75 to 22. At the same time, disk 26 and microprocessor 20 control vacuum pump 80 so the pressure in chamber 40 is 3 millitorr. Simultaneously, hard disk 26 causes the gains of amplifiers 102 and 132 to be such that coil 48 is supplied with 500 watts of RF power at 13.56 MHz while electrode 56 is supplied with 178 watts of RE power at 13.56 MHz; the 178 watts of RE power supplied to electrode 56 causes a DC bias of −200V to be established on the electrode.

Optical spectrometer 90 detects when the etching end point of layer 208 occurs. Microprocessor 20 and memory system 24 respond to the signal from optical spectrometer 90 to cause over etching of layer 208 by 30 percent, a result achieved by not changing the etching parameters in chamber 40.

When the over etch has been completed, microprocessor 20 and memory system 24 cause silicon nitride layer 206 to be etched in a somewhat similar matter to that described in connection with coating 208 until optical spectrometer 90 detects an etch end point. Etching of layer 206 is in response to a suitable mixture of fluorine-based etchants while the chamber 40 pressure is 10 millitorr, the RF power supplied to coil 48 is 1000 watts and the RF power supplied to electrode 56 is 155 watts, resulting in the electrode having a DC bias of −170V.

Microprocessor 20 and memory system 24 then cause silicon nitride layer 206 to be over etched for 10 seconds. The over etch is performed by causing a suitable mixture of fluorine-based etchants argon and oxygen to flow from sources 68 into chamber 40, while the chamber is maintained at a pressure of 7 millitorr, and 1400 and 400 watts RF power are respectively applied to coil 48 and electrode 56. The application of 400 watts RF power to electrode 56 results in the electrode being at a DC voltage of −145 V.

Microprocessor 20 and memory system 24 then cause a breakthrough of silicon oxide layer 204 by causing 100 sccm $Cl_2$ to be applied for five seconds from gas sources 68 to chamber 40, while 500 and 120 watts are respectively applied to coil 48 and electrode 56.

Microprocessor 20 and memory system 24 then cause the main etch operation for shallow trench isolation of silicon substrate 202 to be performed. The main etch operation is performed for 65 seconds in response to a suitable mixture of $HBr/Cl_2/O_2$ flowing from gas sources 68 to chamber 40. During the 65 seconds, vacuum pump 80 maintains the pressure in chamber 40 at 15 millitorr, the output of amplifier 102 supplies coil 48 with 1000 watts and amplifier 132 supplies electrode 56 with 235 watts so that the DC bias voltage of electrode 56 is −320V.

Upon completion of the 65 second main etch operation, the silicon in substrate 202 is at the location indicated by point 212, FIG. 6, slightly above the trench final base 214. The final etch operation of silicon substrate 202 between point 212 and base 214 is performed in such a manner as to achieve rounded edges 216 between point 212 and base 214.

To this end, microprocessor 20 and memory system 24 perform the final etch operation for 15 seconds. During the 15 second final etch operation, vacuum pump 80 maintains the pressure in chamber 40 constant at 10 millitorr, amplifier 102 maintains the power supplied to coil 48 constant at 100 watts and a suitable mixture of $HBr/O_2$ constantly flows from sources 68 into chamber 40, while the power that amplifier 132 supplies to electrode 56 gradually decreases from 200 to 100 watts. The gradual decrease in the power that amplifier 132 supplies to electrode 56 is in 15,000 steps, each having a duration of 1.0 millisecond and an amplitude of 6.667 milliwatts. After base 214 has been reached, the etchant gases are purged from the chamber while the chamber pressure remains constant as does the power supplied to coil 48 and electrode 56. Then workpiece 54 can be removed from chamber 40 for further processing.

If it is desired to provide a rounded corner, wherein the rounded corner is at an intersection of a wall and a surface intersecting the wall, the surface extending generally at right angles to the wall, and wherein the rounded corner is a gradual transition, between the top portion of silicon substrate 202 and a layer deposited thereon, the power applied to electrode 56 and/or coil 48 can be similarly varied while the gas species and the flow rates thereof into chamber 40 are maintained constant, simultaneously with the pressure in chamber 40 remaining constant. Gradual transitions in deposited layers can also be provided by gradually and substantially continuously varying the power applied to coil 48 and/or electrode 56, while maintaining constant the gas species, the flow rates thereof and the pressure in chamber 40. Because of the fast response times of amplifiers 102 and 132, the changes in the gains of these amplifiers almost instantaneously change the characteristics of plasma 50 to provide relatively high throughput processing of workpieces 54 and more accurate control of workpiece processing during a recipe step change than can be provided by varying a parameter such as gas flow rate or chamber pressure.

While there have been described and illustrated specific embodiments of the invention, it will be clear that variations in the details of the embodiments specifically illustrated and described may be made without departing from the true spirit and scope of the invention as defined in the appended claims. For example, the variable gain features provided by amplifiers 102 and 132 can be incorporated directly into RF sources 100 and 130, respectively.

We claim:

1. A method of forming a rounded corner of a trench of a workpiece in a vacuum plasma chamber, comprising:
    converting a gas species that is supplied to the chamber into an etchant plasma that is continuously applied to the workpiece while the rounded corner is being formed;
    gradually changing a first power applied to the etchant plasma through a plasma excitation unit and a second power applied to a conductive layer supporting the workpiece while the rounded corner is being formed, the gradual change being such that each of the first and second powers does not remain constant for durations in excess of one second while the rounded corner is being formed, wherein the first and second powers are gradually changed in a decreasing manner so that the formed rounded corner connects a wall of the trench to a substantially flat base of the trench; and
    while the rounded corner is being formed, maintaining constant: (a) the flow rate of the gas species into the chamber and (b) the species flowing into the chamber.

2. The method of claim 1 wherein the rounded corner is at an intersection of the wall of the trench and the base of the trench and the rounded corner is initially formed at a temporary bottom point of the trench wall so that the rounding provided by the gradual decrease of the first and second powers completes the formation of the trench.

3. The method of claim 1 wherein the rounded corner is at an intersection of the wall of the trench and a surface of the base intersecting the wall, the surface extending generally at right angles to the wall.

4. The method of claim 1 wherein the gradual change includes steps having changes of the first and second powers no greater than about several watts.

5. The method of claim 4 wherein the power steps are a few milliwatts and the first and second powers remain constant for about 1 millisecond.

6. The method of claim 5, wherein the etchant gas is the dominant gas.

7. The method of claim 4 wherein an electric source having a maximum output power applies the gradually changing power to the etchant plasma, the steps having a maximum change of less than 5% of the source maximum output power.

8. The method of claim 1, wherein the etchant gas is the dominant gas.

9. The method of claim 1 wherein pressure in the chamber is maintained constant while the rounded corner is being formed.

10. The method of claim 1 wherein the etchant plasma includes HBr.

11. A method of etching a workpiece in a vacuum plasma processor chamber comprising:
    converting a gas species into an AC etchant plasma that is applied to the workpiece while a desired shape of the workpiece is being formed, the AC etchant plasma always being the dominant material applied to the workpiece while the desired shape is being formed, the vacuum chamber being subject to operating at different pressures while the workpiece is being processed, the gas species being subject to flowing into the chamber at different flow rates while the workpiece is being and processed; and
    gradually changing, on a pre-programmed basis, an AC power supplied to the plasma through a plasma excitation unit and an additional power applied to a conductive layer supporting the workpiece during etching of the workpiece to form the desired shape, wherein a gradual transition in the shape of material that has the desired shape in the workpiece being processed occurs in response to the gradual power change, the gradual change of both the AC power and the additional power occurring during the gradual transition in the shape of the material that has the desired shape, the gradual change of both the AC power and the additional power being such that each of both the AC power and the additional power does not change by more than several watts within one second, and wherein when the desired shape includes a trench of the workpiece, the AC power and the additional power are gradually changed in a decreasing manner so that a curved surface is formed to connect a wall of the trench to a substantially flat base of the trench.

12. The method of claim 11 wherein the etchant plasma is continuously applied to the workpiece while the desired shape is being formed.

13. The method of claim 12 wherein the gradual change of the two powers occurs while no change is made in (a) the species, or (b) the flow rate.

14. The method of claim 13 wherein the gradual change includes steps having power changes no greater than about several watts, the power remaining at a constant wattage for no more than about 1 second.

15. The method of claim 14 wherein the power steps are a few milliwatts and remain at constant powers for about 1 millisecond.

16. The method of claim 14 wherein an electric source having a maximum output power applies the gradually changing power to the etchant plasma, the steps having a maximum change of less than 5% of the source maximum output power.

17. The method of claim 12 wherein the species is ionized into a plasma that etches the material to form the desired shape, the gradual change of the two powers, the species and the continuous application of the plasma to the workpiece being such that the material is shaped to have the curved surface, the curved surface being formed in response to changes in the ionized plasma etchant resulting from the gradual power change.

18. The method of claim 17 wherein the curved surface is a rounded corner, and the etching, which occurs in response to changes in the ionized plasma etchant resulting from the gradual change of the two powers and the continuous application of the plasma to the workpiece, forms the trench wall including the rounded corner, the trench wall and the rounded corner being included in the desired shape.

19. The method of claim 18 wherein the rounded corner is at an intersection of the wall and the base of the trench.

20. The method of claim 17 wherein the curved surface is a rounded corner at an intersection of the wall and a surface of the base intersecting the wall, the surface extending generally at right angles to the wall.

21. The method of claim 12 wherein the gradual change of the two powers includes steps having power changes in the range of a few milliwatts to several watts and durations in the range of about one millisecond to no more than one second.

22. The method of claim 11 wherein the gradual change of the two powers includes steps having power changes no greater than about several watts, the two powers remaining at a constant wattage for no more than about 1 second.

23. The method of claim 11 wherein the etchant plasma includes HBr.

24. A memory storing a computer program for controlling a computer for controlling etching of a workpiece in a vacuum plasma processor chamber wherein a gas species is converted into an AC etchant plasma, the chamber being capable of operating at different pressures while the workpiece is being processed, the gas species being subject to flowing into the chamber at different flow rates while the workpiece is being processed, the computer program storing signals causing:
  (a) control of an AC power applied to the plasma through a plasma excitation unit and an additional power applied to a conductive layer supporting the workpiece while the workpiece is being etched;
  (b) the application of the AC etchant plasma to the workpiece while a desired shape of the workpiece is being formed, and
  (c) the AC etchant plasma to always be the dominant material applied to the workpiece while the desired shape is being formed, the stored signal for controlling the applied AC power and the additional power causing gradual preprogrammed changes in the AC power supplied to the etchant plasma and the additional power during etching of the workpiece, the stored signal causing the gradual change of the two powers to be such as to cause a gradual transition in the shape of material in the workpiece being etched in response to the gradual change of the two powers to cause the gradual change of the two powers to occur during the gradual transition in the shape of the material, the stored signal causing the change of the two powers to be such that at least the AC power does not change by more than several watts within one second, and wherein when the desired shape includes a trench of the workpiece, the two powers are gradually changed in a decreasing manner so that a curved surface is formed to connect a wall of the trench to a substantially flat base of the trench.

25. The memory of claim 24 wherein the computer program causes the etchant plasma to be continuously applied to the workpiece while the desired shape is being formed.

26. The memory of claim 25 wherein the computer program also stores signals for causing (a) the vacuum chamber to operate at different pressures while the workpiece is being etched and (b) control of the gas species type and the flow rates thereof into the chamber while the workpiece is being etched, the stored signals causing the gradual change of the two powers to occur while no change is made in (a) the species, (b) the pressure or (c) the flow rate.

27. The memory of claim 25 wherein the stored signals control (a) etchant species supplied to the chamber while the workpiece is being processed and (b) the gradual transition of the two powers so as to cause the workpiece to be etched to form the curved surface.

28. The memory of claim 27 wherein the curved surface is a rounded corner, and the stored signals control (a) etchant species supplied to the chamber while the workpiece is being processed and (b) the gradual transition of the two powers so as to cause the workpiece to be etched to form the trench wall including the rounded corner.

29. The memory of claim 28 wherein the rounded corner is at an intersection of the wall and a surface of the base of the trench intersecting the wall, the surface extending generally at right angles to the wall.

30. The memory of claim 27 wherein the gradual change of the two powers includes steps having power changes in the range of a few milliwatts to several watts and having durations in the range of about one millisecond to no more than one second.

31. The memory of claim 25 wherein the gradual change of the two powers includes steps having power changes in the range of a few milliwatts to several watts and having durations in the range of about one millisecond to no more than one second.

32. A method of forming, on a substrate, first and second features having different shapes, the first and second features being formed in a vacuum chamber and being contiguous with each other, the method comprising forming the first feature by applying AC etchant plasma to the substrate so that the substrate is etched to a predetermined point, and then initiating formation of the second feature by applying AC etchant plasma to the predetermined point and then continuing formation of the second feature, one of the features being formed by gradually changing a power applied to the AC etchant plasma through a plasma excitation unit and an additional power applied to a conductive layer supporting the workpiece during formation of said one of the features to cause a gradual transition in the shape of said one of the features, wherein when the first feature includes a wall of a trench of the substrate, the two powers are gradually changed in a decreasing manner so that the second feature includes a curved surface formed to connect a wall of the trench to a substantially flat base of the trench.

33. The method of claim 32 wherein the gradual change in the power applied to the AC etchant plasma an the additional power are substantially continuous.

34. The method of claim 33 wherein the chamber pressure, etchant species and etchant flow rate remain constant during the gradual change in the power applied to the AC etchant plasma an the additional power.

35. The method of claim 32 wherein the etchant species and etchant flow rate remain constant during the gradual change in the power applied to the AC etchant plasma an the additional power.

36. The method of claim 35 wherein the curved surface is a rounded corner between the wall of the trench and the base of the trench, the rounded corner being formed in response to the gradual change in the power applied to the AC etchant plasma and the additional power.

37. The method of claim 32 wherein the power change is such that at least the AC the power does not change by more than several watts within one second.

38. The method of claim 32 wherein the etchant plasma in both steps includes HBr.

39. A method of forming a rounded corner between a top portion of a substrate and a layer deposited on the top portion of the substrate comprising, in a vacuum chamber applying AC etchant plasma to the substrate, and gradually changing a power applied to the AC etchant plasma through a plasma excitation unit and an additional power applied to the conductive layer supporting the substrate while the rounded corner is being formed, the rounded corner being formed in response to the gradual change in the power applied to the AC etchant plasma and the additional power, wherein the two powers are gradually changed in a decreasing manner so that the formed rounded corner connects a wall of the layer to a substantially flat surface of the top portion of the substrate.

40. The method of claim 39 wherein the gradual change in the power applied to the AC etchant plasma is substantially continuous.

41. The method of claim 40 wherein the chamber pressure, etchant species and etchant flow rate remain constant during the gradual change of the two powers.

42. The method of claim 39 wherein the etchant species and etchant flow rate remain constant during the gradual change of the two powers.

43. The method of claim 39 wherein the power change of the two powers is such that the change of each of the two powers does not change by more than several watts within one second.

44. The method of claim 39 wherein the etchant plasma in both steps includes HBr.

45. A method of forming a gradual transition in a deposited layer on a substrate comprising, in a vacuum chamber applying an AC etchant plasma to the deposited layer, and gradually changing a power applied to the AC etchant plasma through a plasma excitation unit and an additional power applied to the conductive layer supporting the substrate while the transition is being formed, the gradual transition being formed in response to the gradual change in the power applied to the AC etchant plasma and the additional power, wherein each of the two powers is gradually changed in a decreasing manner so that the formed gradual transition connects a wall of a trench in the deposited layer to a substantially flat base of the deposited layer.

46. The method of claim 45 wherein the gradual change of the two powers is substantially continuous.

47. The method of claim 46 wherein the chamber pressure, etchant species and etchant flow rate remain constant during the gradual change of the two powers.

48. The method of claim 45 wherein the etchant species and etchant flow rate remain constant during the gradual change of the two powers.

49. The method of claim 45 wherein the power change of the two powers is such that the change of each of the two powers does not change by more than several watts within one second.

50. The method of claim 45 wherein the etchant plasma includes HBr.

* * * * *